US008963400B2

(12) United States Patent
Muggler et al.

(10) Patent No.: US 8,963,400 B2
(45) Date of Patent: Feb. 24, 2015

(54) PIEZO DRIVER HAVING RECHARGING CAPABILITY

(75) Inventors: Patrick Muggler, Palo Alto, CA (US); Anthony S. Doy, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 105 days.

(21) Appl. No.: 13/609,577

(22) Filed: Sep. 11, 2012

(65) Prior Publication Data

US 2014/0070666 A1    Mar. 13, 2014

(51) Int. Cl.
    *H02N 2/06*    (2006.01)
(52) U.S. Cl.
    USPC ......................................................... 310/317
(58) Field of Classification Search
    CPC ......... H02N 2/06; H02N 2/062; H02N 2/065; H02N 2/0075
    USPC .................................... 310/314, 316.03, 317
    See application file for complete search history.

(56) References Cited

U.S. PATENT DOCUMENTS 6,133,714 A *    10/2000    Hoffmann et al. ............ 310/317
2009/0121724 A1*    5/2009    Perryman et al. ............. 324/522

OTHER PUBLICATIONS

Linear Technology—Piezo Microactuator Driver with Boost Regulator http://cds.linear.com/docs/en/datasheet/3469f.pdf.
Maxim Integrated Products—14VP-P, Class G Ceramic Speaker Driver, Rev. 3; May 2008 http://datasheets.maximintegrated.com/en/ds/MAX9788.pdf.
Texas Instruments—Piezo Haptic Driver with Integrated Boost Converter, Jun. 2011—Revised Nov. 2012—http://www.ti.com/lit/ds/symlink/drv8662.pdf.

* cited by examiner

*Primary Examiner* — Derek Rosenau
(74) *Attorney, Agent, or Firm* — Advent, LLP

(57) ABSTRACT

A piezo driver is described that is configured to furnish electric charge to a piezo component and configured to transfer electric charge from the piezo component to a passive energy storage component during various operational states of the piezo driver. In one or more implementations, the piezo driver includes a first passive energy storage component and a second passive energy storage component configured to store electric charge. The piezo driver also includes a voltage converter configured to electrically connect between a piezo component and the first passive energy storage component and the second passive energy storage component. The voltage converter is configured to furnish electric charge from the first passive energy storage component to the piezo component, and vice versa. The voltage converter is also configured to furnish electric charge from the second passive energy storage component to the piezo component, and vice versa.

13 Claims, 3 Drawing Sheets ns in the description and the figures

PIEZO DRIVER HAVING RECHARGING CAPABILITY

BACKGROUND

Electronic devices such as smartphones, tablet computers, and so forth, often incorporate touch screen panels for receiving user input. A touch screen panel is a display that can detect the presence, location, or pressure associated with a touch within the display area, such as a finger, hand, stylus, or other pointing device. These touch screen panels may employ piezo components, such as piezoelectric sensors, that are configured to utilize the piezoelectric effect to measure mechanical pressure, acceleration, force, and so forth.

SUMMARY

A piezo driver is described that is configured to furnish electric charge to a piezo component and configured to transfer electric charge from the piezo component to a passive energy storage component during various operational states of the piezo driver. In one or more implementations, the piezo driver includes a first passive energy storage component and a second passive energy storage component configured to store electric charge. The piezo driver also includes a voltage converter configured to electrically connect between a piezo component and the first passive energy storage component and the second passive energy storage component. The voltage converter is configured to furnish electric charge from the first passive energy storage component to the piezo component during a first state of operation and to furnish electric charge from the piezo component to the first passive energy storage component during a second state of operation. The voltage converter is also configured to furnish electric charge from the second passive energy storage component to the piezo component during a third state of operation and to furnish electric charge from the piezo component to the second passive energy storage component during a fourth state of operation.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Haptic feedback technology may incorporate piezo components (e.g., piezoelectric components) that are configured to generate a vibration in response to an electrical signal to generate haptic and/or audio feedback. For example, piezo drivers are utilized to drive a piezo component during the operation of a mobile computing device. Piezo drivers typically build a voltage across the piezo components by forcing current to the piezo component to build electric charge across the component. In some circumstances, a control module determines that a voltage reduction across the piezo component is necessary. In these circumstances, the piezo drivers dump the stored electric charge to ground. When the piezo component generates haptic and/or audio feedback, the voltage across the piezo component increases and decreases many times, which causes inefficient usage of the electric charge.

Accordingly, a piezo driver is described that is configured to furnish electric charge to a piezo component and configured to transfer electric charge from the piezo component to a passive energy storage component during various operational states of the piezo driver. In one or more implementations, the piezo driver includes a piezo component, as well as a first passive energy storage component and a second passive energy storage component configured to store electric charge. In one or more implementations, the first and the second passive energy storage components comprise capacitors. The piezo driver also includes a voltage converter configured to electrically connect between a piezo component and the first passive energy storage component and the second passive energy storage component. The voltage converter is configured to furnish electric charge from the first passive energy storage component to the piezo component during a first state of operation and to furnish electric charge from the piezo component to the first passive energy storage component during a second state of operation. The voltage converter is also configured to furnish electric charge from the second passive energy storage component to the piezo component during a third state of operation and to furnish electric charge from the piezo component to the second passive energy storage component during a fourth state of operation. In an implementation, the piezo driver is incorporated into an electronic device that includes a piezo component. In some configurations, the piezo driver of the present disclosure may improve efficiency by at least or greater than twenty percent (20%) as compared to the efficiency of piezo drivers that dump the electric charge to ground.

Example Piezo Drivers

Figure 1A:
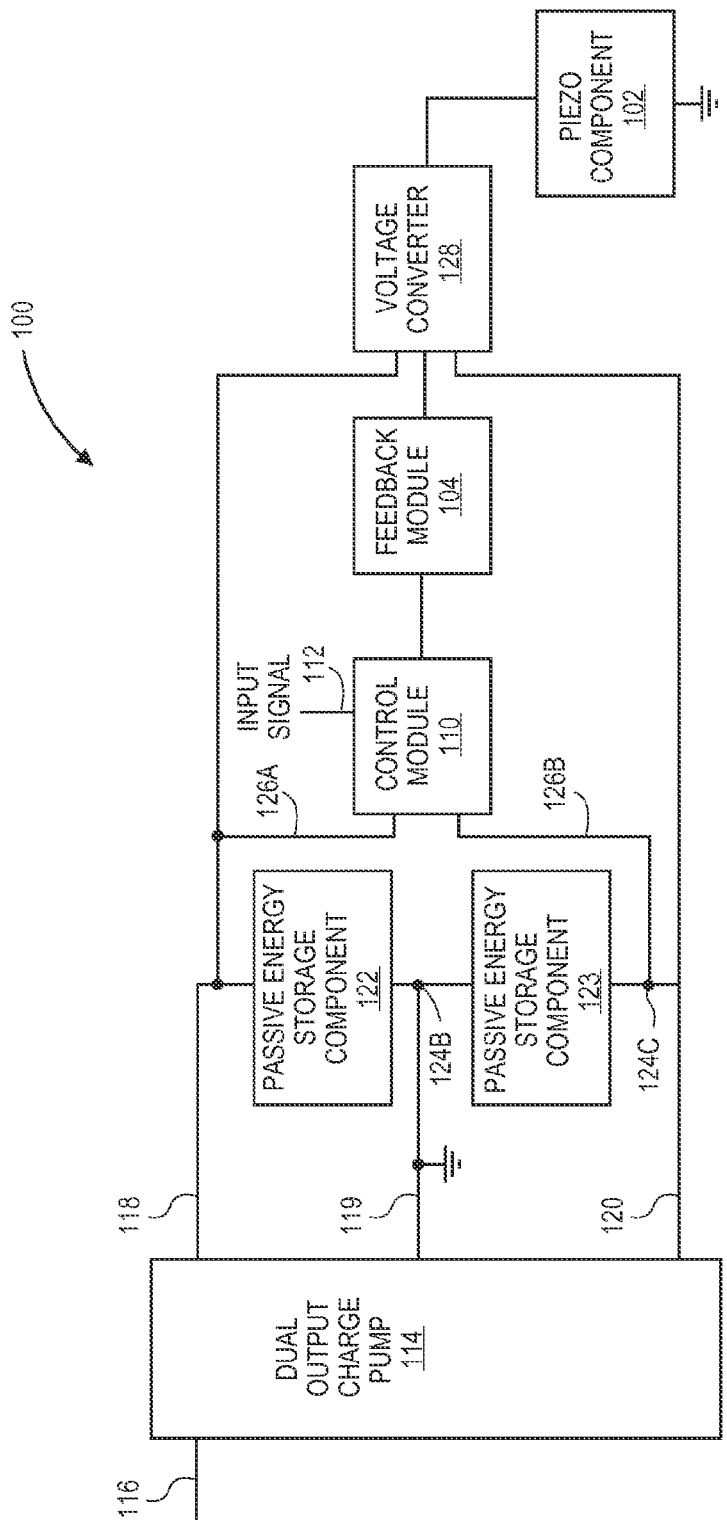
FIG. 1A is a block diagram illustrating a piezo driver in accordance with an example implementation of the present disclosure.
Figure 1B:
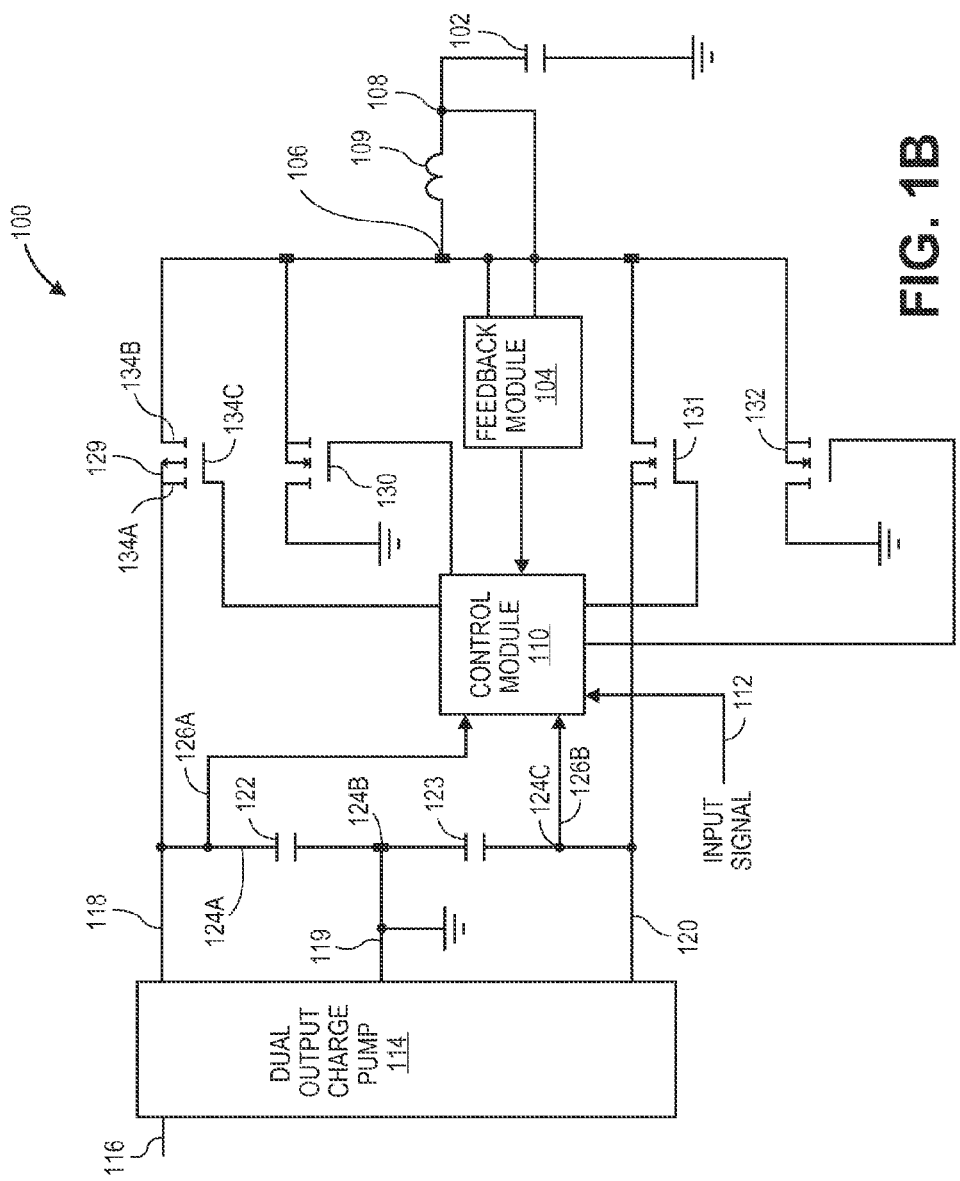
FIG. 1B is a circuit diagram illustrating a piezo driver in accordance with a specific example implementation of the present disclosure.

FIGS. 1A and 1B illustrate a piezo driver 100 in accordance with example implementations of the present disclosure. As shown, the piezo driver 100 is configured to drive a piezo component 102 and recycle charge within the driver 100. The driver 100 may incorporated into an electronic device that includes a piezo component 102, which may be utilized to generate haptic or audio feedback in electronic devices, such as smartphones, tablet computing devices, laptops, and so forth (e.g., electronic devices having touch screens for receiving user input). In specific implementations, the piezo component 102 may comprise an audio piezo amplifier, a piezo haptic driver, a piezo motor driver, or the like, that is configured to furnish haptic signals, audio signals, combinations thereof, or the like, in response to one or more electrical signals. This functionality may allow the generation of tactile and/or audio feedback (e.g., touch screen of a computing device furnishes tactile feedback and/or audio feedback). In an implementation, the piezo component 102 is manufactured from suitable piezo-electric materials, which may include, but are not limited to serial and bimorph piezoelectric materials.

The piezo driver 100 includes a feedback component 104 that is connected across the terminals (e.g., contacts, electrodes) 106, 108 (see FIG. 1B) of a passive energy component 109 (e.g., feedback component 104 is electrically connected in parallel to the passive energy component 109). The feedback component 104 is representative of functionality to measure the voltage across the passive energy component 109 and furnish a signal representing the measured voltage (i.e., measured voltage signal) to a control module 110. The feedback component 104 may be configured in a variety of ways. For example, the feedback component 104 may be comprised of circuitry (e.g., differential amplifier, etc.), software (e.g., computer-executable instructions), firmware, combinations thereof, or the like, that is configured to measure the voltage across the passive energy storage component 109. In a specific implementation, as shown in FIG. 1B, the passive energy component 109 is an inductor. As described in greater detail herein, the inductor is utilized to form a voltage converter that functions as either a boost converter or a buck converter during various operations stages of the piezo driver 100.

The control module 110 is representative of functionality to determine a desired operational state of the driver 100 and to generate control signals at least partially based upon the measured voltage signal from the feedback component 104 (e.g., based upon the desired operational state). In one or more implementations, the control module 110 is also comprised of circuitry, software, firmware, combinations thereof, or the like. The control module 110 also receives an input signal at the input signal terminal 112, which is electrically connected to the control module 110. The control module 110 also receives an input signal at the input signal terminal 112, which is electrically connected to the control module 110. The input signal is generated from an external source (e.g., source external to the driver 100), such as an applications sensor, a touch screen, a digital-to-analog converter (e.g., an audio digital-to-analog converter), or the like. The input signal represents a detection of an event, such as a measurement of the input detected by the external source (e.g., a user's touch over the touch screen, a user's input to the applications sensor, etc.). Once the control module 110 receives the input signal, the control module 110 is configured to compare the input signal to the signal representing the measured voltage across the piezo component 102. Based upon the comparison of the input signal and the measured voltage signal, the control module 110 is configured to determine a state of the piezo component 102, which is described in greater detail below.

As shown, the piezo driver 100 also includes a dual output charge pump 114 (e.g., a boost converter) that is configured to generate (e.g., furnish, output) an output voltage in absolute value terms that is greater than the input voltage. In a specific implementation, the dual output charge pump 114 is a direct current (DC)-to-DC power (boost) converter that converts a source of direct current from one voltage level (e.g., voltage value) to another. For example, the charge pump 114 may be connected to a power source, such as battery of a mobile computing device, by way of a power source connection 116. The charge pump 114 receives an input voltage from the power source and is configured to generate an output voltage greater in absolute value than the input voltage supplied by the power source.

The charge pump 114 includes output terminals 118, 119, 120 that are electrically connected to passive energy storage components 122, 123. More specifically, the output terminal 118 is connected to the terminal 124A of the passive energy storage component 122, the output terminal 119 is connected to the terminal 124B of the passive energy storage component 122 and the passive energy storage component 123, and the output terminal 120 is connected to the terminal 124C of passive energy storage component 123. The terminals 124A, 124C comprise the non-ground terminals of the passive energy storage components 122, 123, respectively, and the terminal 124B comprises the ground terminal that is common to both the passive energy storage components 122, 123. The passive energy storage components 122, 123 are configured to store energy (e.g., store electric charge). In a specific implementation, the passive energy storage components 122, 123 are capacitors (see FIG. 1B). Thus, the charge pump 114 supplies the output voltage, which causes an amount of electric charge to be stored within the passive energy storage components 122, 123 so that the voltage across the components 122, 123 is approximately equal to the output voltages of the charge pump 114. For example, the dual output charge pump 114 is configured to generate a +/−30 V output. Thus, the voltage generated between terminals 124A and 124B is approximately thirty volts (30V), and the voltage generated between the terminals 124C and 124B is approximately negative thirty volts (−30V). Thus, the passive energy storage component 122 is configured to store an electric charge approximately equal to a positive voltage furnished by the dual output charge pump 114, and the passive energy storage component 123 is configured to store an electric charge approximately equal to a negative voltage furnished by the dual output charge pump 114. In an implementation, as shown in FIGS. 1A and 1B, the control module 110 is also electrically connected to the passive energy storage components 122, 123 by way of the connections (e.g., contacts, electrodes) 126A, 126B, respectively, for monitoring the voltage across the passive energy storage components 122, 123. For example, if the voltage is too low (in absolute voltage terms) across either the passive energy storage component 122 or the passive energy storage component 123, the control module 110 is configured to cause the charge pump 114 and/or the power source (e.g., power source connected to power source connection 116) to cause the recharging of the passive energy storage components 122, 123.

As shown in FIG. 1A, the piezo driver 100 also includes a voltage converter 128 configured to convert voltage from a first voltage level to a second voltage level. As described above and as shown in FIG. 1B, the passive energy component 109 comprises a portion of the voltage converter 128. Additionally, the driver 100 includes multiple transistors that comprise the remaining portion of the voltage converter 128 (see FIG. 1B). In an implementation, the driver 100 includes transistors 129, 130, 131, 132, and the transistors 129, 130, 131, 132 are configured to comprise a portion of the voltage converter 128 in combination with the passive energy component 109 during various operational states of the driver 100. Thus, the transistors 129, 130, 131, 132 and the inductor 109 are connected in series, and the inductor 109 is connected in series with the piezo component 102. In an implementation, the transistors 129, 130, 131, 132 are metal-oxide-semiconductor field-effect transistors (MOSFETs). For example, each of the MOSFET devices described herein comprises n-type MOSFET devices. In another example, each of the MOSFET devices described herein comprises p-type MOSFET devices. Thus, the transistors 129, 130, 131, 132 each have an open configuration (e.g., open circuit to prevent current flow) and a closed configuration (e.g., closed circuit to allow current flow). It is contemplated that each transistor described above and herein includes a respective source terminal (e.g., contact, electrode) 134A, a drain terminal 134B, and a gate terminal 134C. For simplicity's sake, only one transistor is referenced as including terminals 134A, 134B, 134C; however, it is understood that each of the transistors within the piezo driver 100 include the above-mentioned terminals, as well as respective source/drain regions and gates. Moreover, while these example source and drain contacts are shown in a specific configuration, it will be appreciated that the source and drain regions of the respective transistor are interchangeable during operation of the piezo driver 100.

The voltage converter 128 is configured to furnish electric charge to (e.g., increase the absolute voltage value across) the piezo component 102 (e.g., drive the piezo component 102) by way of either the passive energy storage component 122 or the passive energy component 123 during a first state of operation and is configured to furnish electric charge to (e.g., increase the absolute voltage value across or recharge) the respective passive storage component 122 or the passive storage component 123 by way of the piezo component 102 during a second state of operation. Each of the gate terminals 134C of the respective transistors 129, 130, 131, 132 is electrically connected to the control module 110. Thus, the control module 110 is configured to cause each of the transistors 129, 130, 131, 132 to selectively transition from the open configuration to the closed configuration, or vice versa. For example, during a first operational state, the control module 110 causes the transistors 129, 132 to be in the closed configuration and the transistors 130, 131 to be in the open configuration. In this operational state, the transistors 129, 132 and the inductor 109 form the voltage converter 128 that allows the transfer of charge between the piezo component 102 and the capacitor 122. In another example, during a second operational state, the control module 110 causes the transistors 130, 131 to be in the closed configuration and the transistors 129, 132 to be in the open configuration. In this operational state, the transistors 130, 131 and the inductor 109 form the voltage converter 128 that allows the transfer of charge between the piezo component 102 and the capacitor 123.

As described above, the control module 110 is configured to determine an operational state of the driver 100 by way of comparing the input signal and the measured voltage signal. For example, based upon the comparison of the input signal and the measured voltage signal, the control module 110 may determine that a positive voltage should be created across the piezo component 102 (e.g., a first operational state). In this state, the control module 110 causes transistors 129, 132 to be in a switching configuration (e.g., module 110 generates a signal causing the respective transistors to be in the switching configuration, or causing the respective transistors to transition from a first configuration to a second configuration) and causes transistors 130, 131 to be in the open configuration (e.g., module 110 generates a signal causing the respective transistors to be in the open configuration). Thus, the terminal 118 is electrically connected to the voltage converter 128 to allow the transfer of charge from the passive energy storage component 122 to the piezo component 102 by way of the voltage converter 128 until a steady state is reached. Hence, the voltage converter is configured to cause the transfer of charge from the passive energy storage component 122 to the piezo component 102. In this state, the voltage converter 128 functions as a buck converter to cause a positive voltage build-up across the piezo component 102.

The control module 110 may also determine (via the comparison described above) that a positive voltage across the piezo component 102 should be decreased (e.g., a second operational state). In this state, the control module 110 causes the transistors 129, 132 to be in the switching configuration (e.g., module 110 generates a signal causing the respective transistors to be in the switching configuration) and causes the transistors 130, 131 to be in the open configuration (e.g., module 110 generates a signal causing the respective transistors to be in the open configuration). The positive terminal 106 is electrically connected to the voltage converter 128 to allow the transfer of charge from the piezo component 102 to passive energy storage component 122 by way of the voltage converter 128 until a steady state is reached (e.g., voltage converter functions as a boost converter). Hence, the voltage converter 128 is configured to cause the transfer of charge from the piezo component to the passive energy storage component 122. Thus, the passive energy storage component 122 may be at least partially recharged (i.e., the charge is recycled) by way of the electric charge from the piezo component 102.

The control module 110 may also determine (via the comparison described above) that a greater negative voltage (i.e., a more negative voltage) across the piezo component 102 should be created (e.g., a third operational state). In this state, the control module 110 causes the transistors 130, 131 to be in the switching configuration (e.g., module 110 generates a signal causing the respective transistors to be in the switching configuration) and causes the transistors 129, 132 to be in the open configuration (e.g., module 110 generates a signal causing the respective transistors to be in the open configuration). Thus, the terminal 108 is electrically connected to the voltage converter 128 to allow the transfer of charge from the passive energy storage component 123 to the piezo component 102 by way of the voltage converter 128 until a steady state is reached. The transfer of charge occurs since the voltage across the passive energy storage component 122 is higher (in absolute voltage value terms) than the voltage across the piezo component 102. In this state, the voltage converter 128 functions as a buck converter to cause a negative voltage build-up across the piezo component 102.

The control module 110 may also determine (via the comparison described above) that a negative voltage across the piezo component 102 should be decreased (e.g., a fourth operational state). In this state, the control module 110 causes the transistors 130, 131 to be in the switching configuration (e.g., module 110 generates a signal causing the respective transistors to be in the switching configuration) and causes the transistors 129, 132 to be in the open configuration (e.g., module 110 generates a signal causing the respective transistors to be in the open configuration). Thus, the terminal 108 is electrically connected to the voltage converter 128 to allow the transfer of charge from the piezo component 102 to passive energy storage component 123 by way of the voltage converter 128 until a steady state is reached (e.g., voltage converter functions as a boost converter). Hence, the voltage converter 128 is configured to cause the transfer of charge from the piezo component to the passive energy storage component 123. Thus, the passive energy storage component 123 may be at least partially recharged (i.e., the charge is recycled) by way of the electric charge from the piezo component 102.

Example Method

Figure 2:
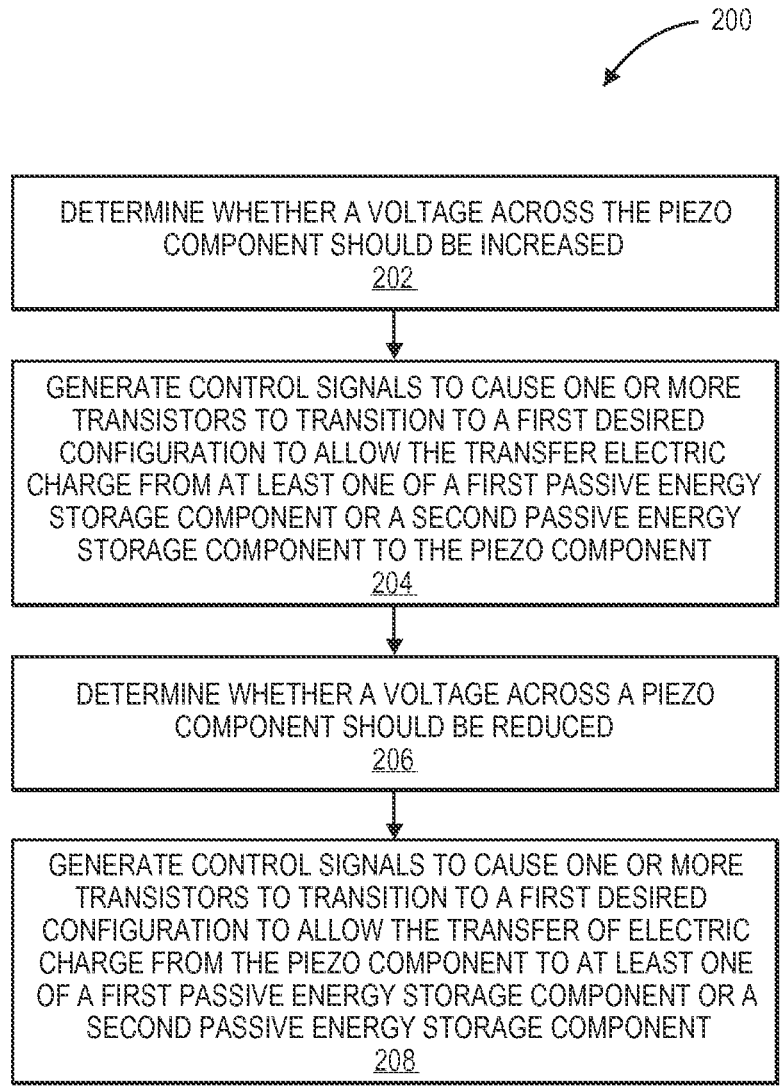
FIG. 2 is a flow diagram illustrating a method for at least partially recharging a storage energy component by way of a piezo component within a piezo driver, such as the piezo driver shown in FIGS. 1A and 1B, according to an example implementation of the present disclosure.

FIG. 2 illustrates a method 200 for at least partially recharging a storage energy component by way of a piezo component within a piezo driver according to an example implementation of the present disclosure. As shown in FIG. 2, a determination is made whether a voltage across a piezo component should be increased (Block 202). As described above, the control module 110 is configured to determine a second operational state of the piezo driver 100 by again comparing an input signal to a signal representing the voltage across the piezo component 102. Specifically, the control module 110, in another example implementation, is configured to determine whether the voltage across the piezo component 102 should be increased (i.e., drive the piezo component 102).

When a determination that the voltage across the piezo component should be increased to drive the piezo component, a control signal is generated to cause one or more switches to transition to a desired configuration to allow the transfer of charge from the passive energy storage component to the passive energy storage component (Block 204). In an implementation, the control module 110 is configured to generate control signals (e.g., voltage values or signals) to control the operation of the transistors 129, 130, 131, 132 (e.g., transition from a switching configuration to a close configuration, or vice versa). For example, depending on the operational state as described in greater detail above, the control module 110 may cause the transistors 129, 132 to transition to the switching configuration and causes the switches 130, 131 to transition to the open configuration, or vice versa. In this example, electric charge from passive storage component 122 is transferred to the piezo component 102 by way of the voltage converter 128 to increase the absolute voltage value across the piezo component 102, which drives the piezo component 102. In another example, depending on the operational state as described in greater detail above, the control module 110 may cause the transistors 130, 131 to transition to the switching configuration and causes the switches 129, 132 to transition to the open configuration, or vice versa. In this example, electric charge from passive storage component 123 is transferred to the piezo component 102 by way of the voltage converter 128 to increase the absolute voltage value across the piezo component 102, which drives the piezo component 102.

As shown in FIG. 2, a determination is made whether a voltage across a piezo component should be reduced (Block 206). As described above, the control module 110 is configured to determine a first operational state of the piezo driver 100 by comparing an input signal to a signal representing the voltage across the piezo component 102. Specifically, the control module 110, in an example implementation, is configured to determine whether the voltage across the piezo component 102 should be decreased, or be reduced. For example, the voltage may be decreased across the piezo component 102 to return the piezo component 102 to its original state (e.g., non-driven state).

When a determination that the voltage across the piezo component should be reduced, a control signal is generated to cause one or more switches to transition to a desired configuration to allow the transfer of charge from the piezo component to a passive energy storage component (Block 208). In an implementation, the control module 110 is configured to generate control signals (e.g., voltage values or signals) to control the configuration of the transistors 129, 130, 131, 132 (e.g., transition from a switching configuration to an open configuration, or vice versa). Thus, the desired configuration may be the same configuration as the configuration described in Block 204. For example, depending on the operational state as described in greater detail above, the control module 110 causes the transistors 129, 132 to transition to the switching configuration and causes the transistors 130, 131 to transition to the open configuration, or vice versa. In this example, electric charge from piezo component 102 is transferred to the passive energy storage component 122 to at least partially recharge the passive energy storage component 122 by way of the voltage converter 128, which may allow for the re-use of the electric charge during the next operational state (e.g., re-use the electric charge to drive the piezo component 102). In another example, depending on the operational state as described in greater detail above, the control module 110 causes the transistors 130, 131 to transition to the closed configuration and causes the transistors 129, 132 to transition to the open configuration, or vice versa. In this example, electric charge from piezo component 102 is transferred to the passive energy storage component 123 to at least partially recharge the passive energy storage component 123 by way of the voltage converter 128, which may allow for the re-use of the electric charge during the next operational state (e.g., re-use the electric charge to drive the piezo component 102).

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims. As used herein, the term "approximately" shall mean approximately and/or exactly with respect to the value or range of values specified.

What is claimed is:

1. A piezo driver comprising:
   a first passive energy storage component and a second passive energy storage component, the first passive energy storage component and the second passive energy storage component configured to store electric charge;
   a voltage converter configured to electrically connect between a piezo component and the first passive energy storage component and the second passive energy storage component, wherein the voltage converter is configured to furnish electric charge from the first passive energy storage component to the piezo component during a first state of operation and to furnish electric charge from the piezo component to the first passive energy storage component during a second state of operation, the voltage converter configured to furnish electric charge from the second passive energy storage component to the piezo component during a third state of operation and to furnish electric charge from the piezo component to the second passive energy storage component during a fourth state of operation; and
   a dual output charge pump electrically connected to the first passive energy storage component and the second passive energy storage component, the dual output charge pump configured to generate a first output voltage and a second output voltage greater in absolute value than an input voltage furnished to the dual output charge pump, the first passive energy storage component configured to store an electric charge such that a voltage across the first passive energy storage component approximately equals the first output voltage and the second passive energy storage component configured to store an electric charge such that a voltage across the second passive energy storage component approximately equals the second output voltage.

2. The piezo driver as recited in claim 1, wherein at least one of the first passive energy storage component or the second passive energy storage component comprises a capacitor.

3. The piezo driver as recited in claim 1, further comprising a plurality of transistors and a passive energy component, each of the plurality of transistors connected in series with the passive energy component, the passive energy component connected in series with the piezo component, each of the plurality of transistors having an open configuration and a closed configuration.

4. The piezo driver as recited in claim 3, further comprising a control module electrically connected to each of the plurality of transistors, the control module configured to cause each of the plurality of transistors to transition between the open configuration and the closed configuration to cause at least two of the plurality of transistors and the passive energy component to form the voltage converter.

5. The piezo driver as recited in claim 4, further comprising a feedback component configured to electrically connect in parallel with the piezo component and electrically connected to the control module, the feedback component configured to measure a voltage value across the piezo component and furnish a signal representing the voltage value to the control module, wherein the control module is configured to transition each of the plurality of transistors between the open configuration and the closed configuration based upon the signal representing the voltage value.

6. The piezo driver as recited in claim 3, wherein at least one of the plurality of transistors comprises a metal-oxide-semiconductor field-effect transistor (MOSFET).

7. The piezo driver as recited in claim 3, wherein at least one of the plurality of transistors comprises an n-type MOSFET device.

8. A piezo driver comprising:
a piezo component;
a first passive energy storage component and a second passive energy storage component, the first passive energy storage component and the second passive energy storage component configured to store electric charge;
a voltage converter electrically connected between the piezo component and the first passive energy storage component and the second passive energy storage component, wherein the voltage converter is configured to furnish electric charge from the first passive energy storage component to the piezo component during a first state of operation and to furnish electric charge from the piezo component to the first passive energy storage component during a second state of operation, the voltage converter configured to furnish electric charge from the second passive energy storage component to the piezo component during a third state of operation and to furnish electric charge from the piezo component to the second passive energy storage component during a fourth state of operation; and
a dual output charge pump electrically connected to the first passive energy storage component and the second passive energy storage component, the dual output charge pump configured to generate a first output voltage and a second output voltage greater in absolute value than an input voltage furnished to the dual output charge pump, the first passive energy storage component configured to store an electric charge such that a voltage across the first passive energy storage component approximately equals the first output voltage and the second passive energy storage component configured to store an electric charge such that a voltage across the second passive energy storage component approximately equals the second output voltage.

9. The piezo driver as recited in claim 8, further comprising a plurality of transistors and an inductor, each of the plurality of transistors connected in series with the inductor, the inductor connected in series with the piezo component, each of the plurality of transistors having an open configuration and a closed configuration.

10. The piezo driver as recited in claim 9, further comprising a control module electrically connected to each of the plurality of transistors, the control module configured to cause each of the plurality of transistors to transition between the open configuration and the switching configuration to cause at least two of the plurality of transistors and the inductor to form the voltage converter.

11. The piezo driver as recited in claim 10, further comprising a feedback component electrically connected in parallel with the piezo component and electrically connected to the control module, the feedback component configured to measure a voltage value across the piezo component and furnish a signal representing the voltage value to the control module, wherein the control module is configured to transition each of the plurality of transistors between the open configuration and the closed configuration based upon the signal representing the voltage value.

12. The piezo driver as recited in claim 9, wherein at least one of the plurality of transistors comprises a metal-oxide-semiconductor field-effect transistor (MOSFET).

13. The piezo driver as recited in claim 9, wherein at least one of the first passive energy storage component or the second passive energy storage component comprises a capacitor.

* * * * *